United States Patent [19]

Johnson et al.

[11] 4,176,004
[45] Nov. 27, 1979

[54] METHOD FOR MODIFYING THE CHARACTERISTICS OF A SEMICONDUCTOR FUSIONS

[75] Inventors: Joseph E. Johnson; Edward Dombrowski, both of Pittsburgh, Pa.

[73] Assignee: Westinghouse Electric Corp., Pittsburgh, Pa.

[21] Appl. No.: 935,429

[22] Filed: Aug. 21, 1978

[51] Int. Cl.² .......................................... H01L 21/306
[52] U.S. Cl. .................................. 156/643; 156/646; 156/657; 156/662; 204/192 E; 252/79.1
[58] Field of Search ............... 156/626, 643, 646, 657, 156/662; 204/192 E, 164; 29/571, 580, 610; 252/79.1

[56] References Cited
U.S. PATENT DOCUMENTS

| 2,783,197 | 2/1957 | Herbert | 156/662 X |
| 3,897,286 | 7/1975 | DeCecco et al. | 156/662 X |
| 4,007,104 | 2/1977 | Summers et al. | 156/643 X |

Primary Examiner—William A. Powell
Attorney, Agent, or Firm—J. B. Hinson

[57] ABSTRACT

A method for etching semiconductor fusions to change their electrical characteristic, especially to reduce the firing current of thyristor fusions, to a predetermined desired value is disclosed.

The etching is accomplished by subjecting fusions comprised of a body of semiconductor material, for example, silicon, including an anode emitter region therein and an anode electrode affixed thereto, an anode base region, a cathode base region and a gate electrode affixed thereto, and a cathode emitter region having a cathode electrode affixed thereto, to a plasma etchant comprising a mixture of $CF_4$ and a carrier gas such for example, nitrogen, for a predetermined time interval. Following this etching cycle the firing current of the fusions is measured. Any fusions having a firing current in excess of the desired value at the end of the first etching cycle are subjected to another etching cycle to further reduce the firing current. The etching and measurement cycle is repeated for a predetermined number of cycles. Any fusions having a firing current in excess of the desired value after the predetermined number of etch cycles are scraped.

8 Claims, 4 Drawing Figures

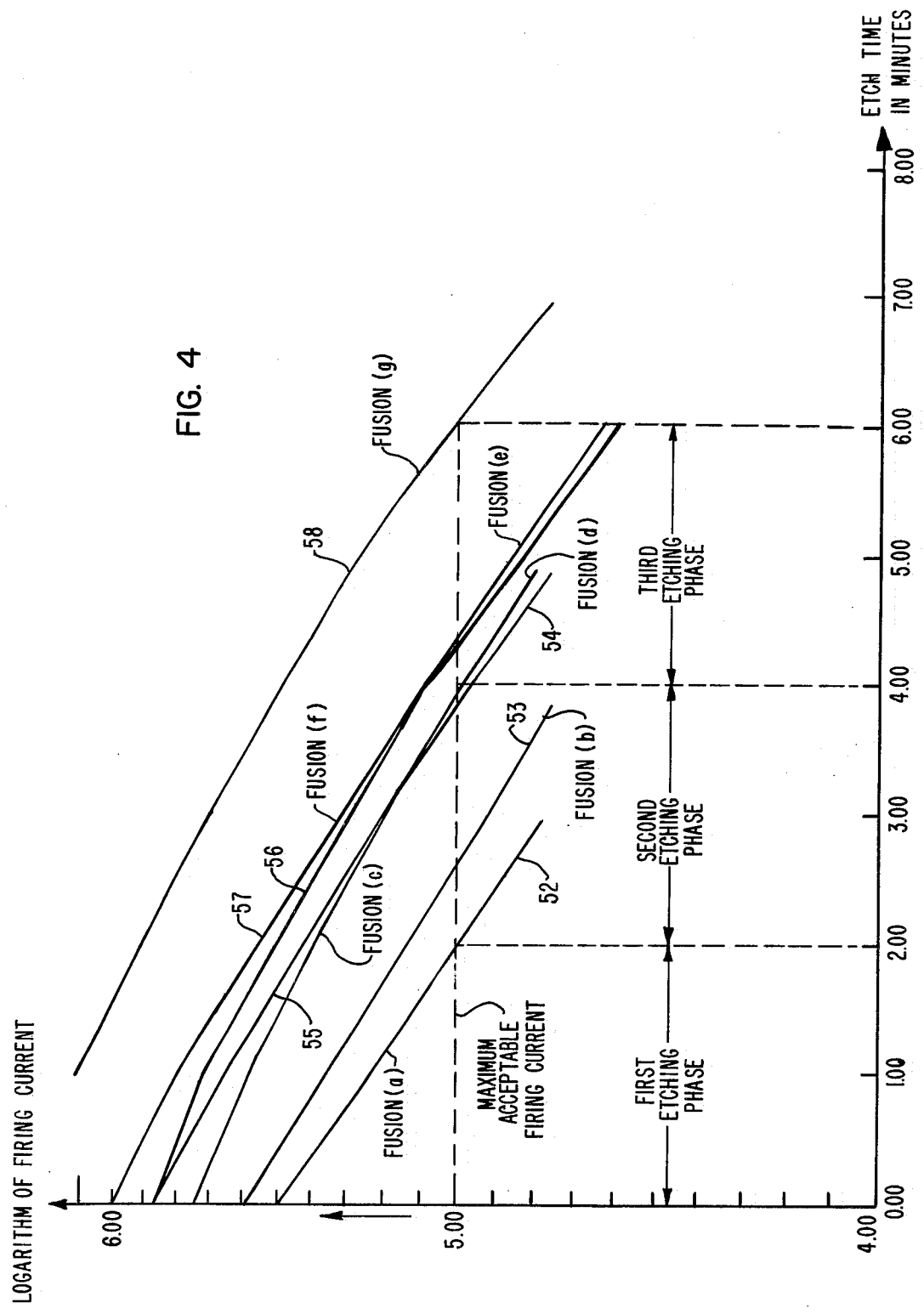

METHOD FOR MODIFYING THE CHARACTERISTICS OF A SEMICONDUCTOR FUSIONS

BACKGROUND OF THE INVENTION

1. Field of the Invention

The invention relates to processes for etching semiconductor fusions to change their electrical characteristics and more particularly to a process for etching fusions to reduce the firing current to a predetermined desired value.

2. Description of the Prior Art

It is well known in the prior art that the firing current of fusions used in thyristors can be reduced by etching the fusion to selectively remove semiconductor material which is exposed in an area adjacent the gate electrode. In the prior art this etching was performed using a small glass dropper to place an etching solution comprising hydrofluoric, nitric, and acetic acids on the area to be etched. Normally, this etching process is carried out prior to spin etching and passivation in order to avoid contamination of these coatings. However, the etching could be done after the passivation with a great deal of operation care and skill due to the possibility of damaging the passivation layer. The care and skill required made prior art etching procedure impractical. It is also known in the prior art that silicon can be plasma etched.

SUMMARY OF THE INVENTION

The invention comprises a method for etching a fusion which includes a body of semiconductor material, portions of which are exposed, to change its electrical characteristic. The method comprises the steps of disposing the fusion to be etched in a plasma etching chamber, establishing a predetermined flow of a gas which ionizes in the presence of an RF field through the etching chamber, establishing an RF field in said etching chamber thereby ionizing said gas to produce ions which react with the exposed portions of the body of semiconductor material to form gaseous etching by-products which are removed from the etching chamber by an exhaust pump.

DESCRIPTION OF THE DRAWINGS

FIG. 4 is a series of curves illustrating the change in the firing current of thyristor fusions as a function of the etching time.

DESCRIPTION OF THE PREFERRED EMBODIMENT

The term "fusion" is widely utilized in the semiconductor art to denote a structure comprising a body of semiconductor material having at least one PN junction therein and metal electrodes affixed thereto, usually on opposed major surfaces of the body of semiconductor material. For purposes of this preferred embodiment the term "fusion" is used to denote a body of semiconductor material, for example silicon, including an anode emitter region therein and an anode electrode affixed thereto, an anode base region, a cathode base region and a gate electrode affixed thereto, and a cathode emitter region having a cathode electrode affixed thereto.

Figure 1:
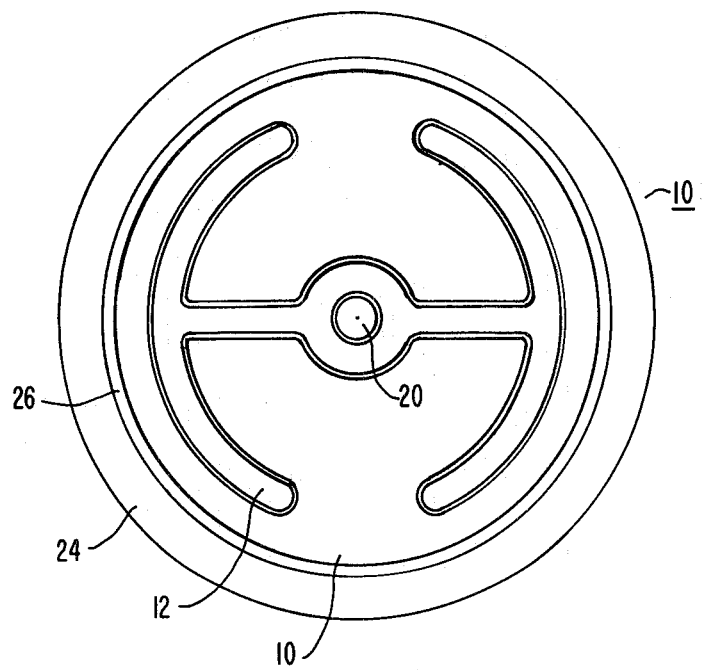
FIG. 1 is a top view of a typical thyristor fusion.

FIG. 1 illustrates a fusion 9 which can be etched utilizing the disclosed process to adjust the firing current to the desired value. The fusion is illustrated in FIG. 1 in top view and in cross section in FIG. 2.

The fusion 9 includes a body of semiconductor material 13 having a cathode emitter region 11, an amplifying gate emitter region 14, a cathode emitter base region 15, an anode emitter base region 21 and anode emitter region 22 therein. A cathode electrode 10 is affixed to the cathode emitter region 11. An amplifying gate electrode 12 is affixed to the upper surface 113 of the body of semiconductor material 13. The amplifying gate electrode 12 electrically shorts a PN junction formed at the intersection of the amplifying gate emitter region 14 with the cathode base region 15. A gate electrode 20 is affixed to the cathode base region 15. The cathode base region 15 extends to outer edge 19 of the body of semiconductor material 13. Similarly, the anode base region 21 and the anode emitter region 22 extend to the edge 19 of the body of semiconductor material 13. First and second PN junctions, 115 and 121, are respectively formed along the intersection of the cathode base region 15 with the anode base region 21 and along the intersection of the anode base region 21 with the anode emitter region 22. Metallic anode electrode is affixed to a surface 122 of the anode emitter region 22.

Passivation of the PN junctions 115 and 121 which extend to the edge 19 of the body of semiconductor material 13 is provided by a layer of cured organic resin 24.

A cathode contact preform 25 overlies the cathode electrode 10 and is affixed to the fusion 10 by a thin layer 26 of room temperature vulcanizing silicon rubber such as RTV 11 sold by General Electric. The cathode contact preform 25 permits electrical contact to be made to the cathode electrode 10 through a flat surface without contacting the amplifying gate electrode 12.

The cathode emitter region 11, the amplifying gate emitter region 14 and the anode base region 21 are preferably N conductivity type regions. Cathode base region and anode emitter region, 15 and 22 are preferably P conductivity type. A metal such as molybdenum is the preferred material for the anode electrode 23 and the cathode contact preform 25. Vapor deposited aluminum may be utilized to form the cathode electrode 10, the amplifying gate electrode 12 and the gate electrode 20.

The completed fusion 10 as described above can be constructed using well known prior art processes and techniques.

Figure 3:
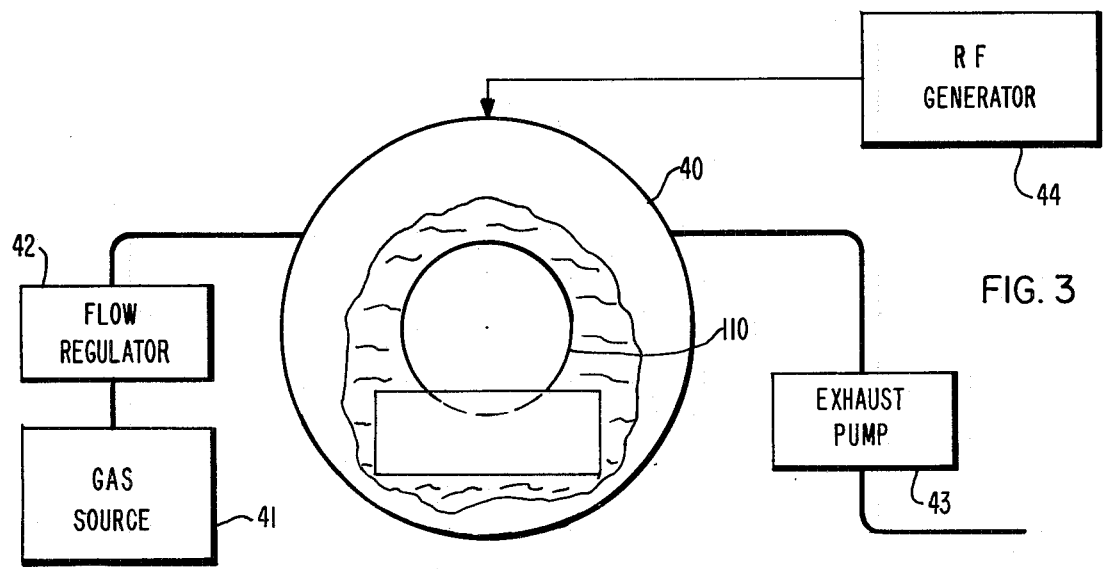
FIG. 3 is a schematic diagram of the plasma etching apparatus utilized in practicing the invention.

FIG. 3 is a schematic diagram illustrating the plasma etching apparatus. A typical plasma etching apparatus includes a cylindrical etching chamber 40. Etching gas is supplied into the etching chamber 40 from a gas source 41 through a flow regulator 42. The etching gas and the etching by-products are removed from the etching chamber 40 by an exhaust pump 43. An RF field is established in the etching chamber 40 by an RF generator 44 through an induction coil (not shown) positioned around the etching chamber 40. Suitable etching apparatus exemplary of the type illustrated in FIG. 3 may be purchased on the open market. A suitable type of etching apparatus is Type 301 manufactured by LFE Corporation.

The gas source 41, the flow regulator 42 and the exhaust pump 43 may also be standard commercially available items.

The preferred etching gas is a mixture of approximately $5.1 \times 10^5$ parts/million $CF_4$ with the remainder carrier gas being nitrogen. Other ratios ranging from $4.0 \times 10^4$ to $6.0 \times 10^5$ parts/million of $CF_4$ with the remainder nitrogen are also usable. An increase in the concentration of $CF_4$ with respect to nitrogen increases the etching rate. Other gases having molecules consisting of carbon and fluorine are also usable. Examples of other usable gases are selected fluorinated hydrocarbons, for example, $C_2F_6$ and $C_3F_8$. The principal requirement for a suitable gas is that when it ionizes it produces a fluorine ion without producing other detrimental elements such as free chlorine, for example. Other carrier gases such as oxygen are also usable. However, if fusions including organic coatings are to etched oxygen may damage these coatings. In all cases, the etching gas may contain incidential impurities.

In practicing the invention a representative fusion 110 or a plurality of fusions to be etched are placed in the etching chamber 40. The limitation on the number of fusions which can be simultaneously etched is determined by the dimensions of the etching chamber 40 and the means used to support the fusions. The basic requirement in positioning the fusions is that the surface to be etched is exposed to the etching gas.

After the fusion or fusions to be etched are positioned in the etching chamber 40 gas flow regulator 42 and exhaust pump 43 are adjusted to give a flow rate 250 to 350 cubic centimeter per minute through the plasma etching chamber 40. Exhaust pump 43 is adjusted to give a pressure in the etching chamber 40 in the range of 1.0 to 1.5 millimeters of mercury. The RF generator 44 is energized and adjusted to a power level between 200 and 250 watts to form an RF field in the etching chamber 40. In the presence of the RF field the $CF_4$ ionizes to form fluorine ions. Portions of the fluorine ions react with the exposed portions of the body of silicon material 13 (FIG. 1) which includes an area adjacent the gate electrode 20 (FIG. 1) to form silicon fluoride. The silicon fluoride as a gas is removed from the etching chamber 40 by the exhaust pump 43.

A major portion of the firing current flows from the gate electrode 20 to the amplifying gate emitter region 14. Removing a portion of the body of semiconductor material 13 in the regions surrounding the gate electrode 20 changes the distribution of the firing current in the body of semiconductor material 13 thereby lowering the firing current of the thyristor. All the exposed portions of the body of semiconductor (silicon) material 13 are etched. However, it is primarily the etching of the exposed portions of the body of semiconductor material adjacent the gate electrode 20 that reduces the firing current.

The rate of the etching process is a function of temperature and the relative concentration of the $CF_4$ and the nitrogen gases. Experiments indicate that adequate etching rates can be achieved at ambient room temperatures using $5.1 \times 10^5$ parts/million $CF_4$ and $4.9 \times 10^5$ parts/million nitrogen. The LFE Model 301 plasma etching apparatus includes interlocks which prevent energizing the RF generator until the proper pressure and flow rate of the etching gas has been established. If the RF generator did not include these interlocks, the RF generator could be energized before the proper pressure and flow rate of the etching gas is established.

Figure 2:
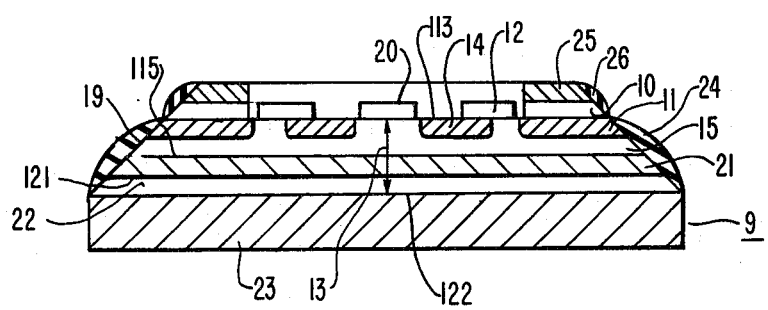
FIG. 2 is a cross-sectional view of the fusion illustrated in FIG. 1 including a cathode contact preform affixed to the cathode electrode.

FIG. 4 is a series of curves, 52 through 58, illustrating the change in firing current of seven typical fusions (labeled fusion (a) through fusion (g)) of the type illustrated in FIGS. 1 and 2 as a function of the etch time in minutes. These seven fusions comprises an exemplary group of fusions and will be used to illustrate the use of the disclosed process. The logarithm of the firing current is shown along the vertical axis with the etching time in minutes shown along the horizontal axis. For the particular fusion whose firing currents are illustrated in FIG. 4, the maximum acceptable value for the logarithm of the firing current is 5. As can be seen from FIG. 4 the logarithm of initial firing current of the fusions used in this example range from 5.5 to approximately 7.

A curve identified by reference numeral 52 (FIG. 4) illustrates the change in the firing current fusion (a). Fusion (a) also had an initial firing current lower than any other fusion included in the exemplary group. A curve identified by reference numeral 58 illustrates the change in the firing current as a function of etching time for the fusion (g). Fusion (g) had an initial firing current higher than any other fusion included in the exemplary group. Curve 52 shows that the firing current of the fusion (a) was reduced to the desired value by a two minute etch. Similarly, the firing current of the fusion (g) was decreased to the desired value with an etching time of approximately six minutes. Therefore, for fusions of this design etching was divided into three phases. During the first phase all of the fusions were etched for two minutes. The first etching phase reduced the firing current of fusion (a) to the desired value. During the second phase fusions (b) through (g) were etched for an additional two minutes. As can be seen from FIG. 4 at the end of the second etching phase the firing current of fusions (b) through (d) had reduced to an acceptable value. Following the second etching phase, fusions (e), (f) and (g) were etched for an additional two minutes during the third phase. Third etching phase reduced the firing of all of the fusions comprising the exemplary group to or below the maximum acceptable value. If the exemplary group of fusions had included any fusions having a firing current exceeding the desired value after the third etching phase, such fusions would have been discarded as unacceptable.

It is obvious that other etching intervals could be used and more or less than the three etching cycles could be selected. The etching intervals and the number of cycles is dependent upon design of the fusions and the degree of etching which is permissible to adjust the firing current.

The above-described process also permits fusions to be etched after the cathode contact preform 25 (FIG. 1) has been secured to the fusion 10 by the thin layer of RTV rubber 25. Thyristors at this stage of assembly cannot be etched using the prior art acid process because acid which seeps between the contact preform 25 and the cathode electrode 10 is practically impossible to remove. This trapped acid will contaminate the thyristor causing the electrical characteristics to degrade.

We claim:
1. A method for etching a thyristor fusion to lower the firing current to a desired value, consisting of the steps of:
   (a) disposing at least one thyristor fusion in a plasma etching chamber, said fusion comprising a body of semiconductor material including an anode emitter region therein and an anode electrode affixed thereto, an anode base region, a cathode base region and a gate electrode affixed thereto with portions of said body of semiconductor material exposed in an area adjacent to said gate electrode and a cathode emitter region having a cathode electrode affixed thereto, each of at least one thyristor fusion having a firing current in excess of a desired predetermined value;

(b) establishing a predetermined flow rate of a selected gas mixture through said plasma etching chamber;

(c) establishing an RF field in said etching chamber whereby said selected gas ionizes to produce ions which react with said exposed portions of said body of semiconductor material to produce gaseous etching by-products;

(d) thereby etching said exposed portions of said body of semiconductor material;

(e) continuing said etching for a predetermined time interval; and (f) removing said at least one fusion from said plasma etching chamber and measuring the firing current of said at least one fusion.

2. The method of etching a thyristor fusion to lower its firing current in accordance with claim 1, further including the steps of:

(a) separating said fusions after step f has been completed into two groups, said first group comprising fusion having a firing current equal to or lower than said desired predetermined value, said second group comprising fusion having a firing current in excess of said desired predetermined value; and (b) repeating steps (a) through (e) as specified in claim 1 to further reduce the firing current of said second group of fusion.

3. A method for etching a thyristor fusions to lower the firing current to a desired value in accordance with claim 1 wherein said ions which react with exposed portions of said body of semiconductor material are fluorine ions formed by portions of said selected gas ionizing in the presence of said RF field.

4. A method for etching a thyristor fusion to lower the firing current to a desired value, in accordance with claim 3 wherein said selected gas comprises a predetermined mixture of $CF_4$ and nitrogen.

5. A method for etching a thyristor fusion to lower the firing current to a desired value in accordance with claim 4 wherein said predetermined mixture of $CF_4$ and nitrogen comprises in the range of $4.0 \times 10^4$ parts per million to $6.0 \times 10^5$ parts per million $CF_4$ with the remainder nitrogen.

6. A method for etching a thyristor fusion to lower the firing current to a derived value in accordance with claim 5 wherein said predetermined mixture of $CF_4$ and nitrogen comprises $5.1 \times 10^5$ parts per million $CF_4$ with the remainder nitrogen.

7. A method for etching a thyristor fusion which includes a body of semiconductor including exposed portions and an organic coating overlying the edge of said body of semiconductor to modify the firing current of said fusion, comprising the steps of:

(a) positioning the said thyristor fusion in a plasma etching chamber;

(b) establishing an atmosphere comprising a predetermined mixture of $CF_4$ and nitrogen in said etching chamber;

(c) establishing an RF field in said plasma etching chamber, said RF field ionizing said $CF_4$ to produce fluorine ions, said fluorine ions etching exposed portions of said body of semiconductor material;

(d) removing said thyristor from said etching chamber and measuring the firing current; and (e) repeating steps a through c as required to reduce the firing current of said thyristor to an acceptable value.

8. A method for etching a fusion to change its electrical characteristics, consisting of the steps of:

(a) disposing said semiconductor fusion in a plasma etching chamber, said semiconductor device comprising a body of semiconductor material having at least first and second regions of opposite conductivity type therein and at least first and second electrodes respectively affixed to said first and second regions with portions of said body or semiconductor material exposed;

(b) establishing a predetermined flow rate of a selected gas mixture through said plasma etching chamber;

(c) establishing an RF field in said etching chamber whereby said selected gas ionizes to produce ions which react with said exposed portions of said body of semiconductor material to produce gaseous etching by-products thereby etching said exposed portions of said body of semiconductor material;

(d) continuing said etching for a predetermined time interval to selectively remove said exposed portions of said body of semiconductor material to change the current flow pattern from said first electrode through said first region to said second region thereby selectively changing the electrical characteristics of said semiconductor fusion.

* * * * *